(12) United States Patent
Geiger et al.

(10) Patent No.: US 10,484,808 B2
(45) Date of Patent: Nov. 19, 2019

(54) AUDIO SIGNAL PROCESSING APPARATUS AND METHOD FOR PROCESSING AN INPUT AUDIO SIGNAL

(71) Applicant: HUAWEI TECHNOLOGIES CO., LTD., Shenzhen, Guangdong (CN)

(72) Inventors: Juergen Geiger, Munich (DE); Peter Grosche, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/920,006

(22) Filed: Mar. 13, 2018

(65) Prior Publication Data

US 2018/0213342 A1   Jul. 26, 2018

Related U.S. Application Data

(63) Continuation of application No. PCT/EP2016/055622, filed on Mar. 16, 2016.

(51) Int. Cl.
*H04S 5/00* (2006.01)
*H04R 3/04* (2006.01)
(Continued)

(52) U.S. Cl.
CPC ............ *H04S 5/005* (2013.01); *G10L 21/038* (2013.01); *H04R 3/04* (2013.01); *G10L 19/008* (2013.01); *G10L 21/0364* (2013.01); *H03G 5/165* (2013.01); *H04S 7/307* (2013.01); *H04S 2400/01* (2013.01); *H04S 2400/05* (2013.01)

(58) Field of Classification Search
None
See application file for complete search history.

(56) References Cited

U.S. PATENT DOCUMENTS 6,606,388 B1   8/2003   Townsend et al.
6,865,430 B1   3/2005   Runton et al.
(Continued)

FOREIGN PATENT DOCUMENTS

EP   1915026 B1   7/2013
EP   2942982 A1 * 11/2015   ............... H04S 7/30

OTHER PUBLICATIONS

Nay OO, Woon-Seng Gan, Perceptually-Motivated Objective Grading of Nonlinear Processing in Virtual-Bass Systems. J. Audio Eng. Soc., vol. 59, No. 11, Nov. 2011, 21 pages.
(Continued)

*Primary Examiner* — Qin Zhu
(74) *Attorney, Agent, or Firm* — Fish & Richardson P.C.

(57) ABSTRACT

Example audio signal processing apparatuses and methods for processing an input audio signal into an output audio signal are disclosed. An example audio signal processing apparatus comprises a decomposer configured to decompose the input audio signal into a direct audio signal and a diffuse audio signal, a modifier configured to modify the direct audio signal in order to obtain a modified direct audio signal, wherein the modifier comprises a bandwidth extender configured to extend an upper cutoff frequency of a frequency range of the direct audio signal, and a combiner configured to combine the modified direct audio signal with the diffuse audio signal to obtain the output audio signal.

13 Claims, 7 Drawing Sheets

(51) Int. Cl.
*G10L 21/038* (2013.01)
*H04S 7/00* (2006.01)
*H03G 5/16* (2006.01)
*G10L 21/0364* (2013.01)
*G10L 19/008* (2013.01)

(56) References Cited

U.S. PATENT DOCUMENTS

| | | | |
|---|---|---|---|
| 7,916,876 B1 | 3/2011 | Helsloot et al. | |
| 8,116,459 B2* | 2/2012 | Disch | H04S 3/002 381/10 |
| 9,135,920 B2 | 9/2015 | Soulodre | |
| 2003/0235317 A1* | 12/2003 | Baumgarte | G10L 15/22 381/119 |
| 2008/0069366 A1* | 3/2008 | Soulodre | G01H 7/00 381/63 |
| 2010/0061558 A1* | 3/2010 | Faller | G10L 19/008 381/23 |
| 2011/0081024 A1 | 4/2011 | Soulodre | |
| 2013/0272526 A1* | 10/2013 | Walther | H04S 3/008 381/1 |
| 2014/0177857 A1* | 6/2014 | Kuster | H04R 25/407 381/66 |
| 2016/0150343 A1* | 5/2016 | Wang | G10L 19/20 381/103 |
| 2016/0329061 A1* | 11/2016 | Heber | G10L 19/26 |

OTHER PUBLICATIONS

Jianjun He et al., Linear Estimation Based Primary-Ambient Extraction for Stereo Audio Signals. IEEE/ACM Transactions on Audio, Speech, and Language Processing, vol. 22, No. 2, Feb. 2014, 13 pages.

Christof Faller, Multiple-Loudspeaker Playback of Stereo Signals. J. Audio Eng. Soc., vol. 54, No. 11, Nov. 2006, 15 pages.

Manish Arora et al., High Quality Blind Bandwidth Extension of Audio for Portable Player Applications. Audio Engineering Society Convention Paper 6761, Presented at the 120th Convention May 20-23, 2006, Paris, France, 6 pages.

International Search Report issued in International Application No. PCT/EP2016/055622 dated Dec. 20, 2016, 10 pages.

* cited by examiner

AUDIO SIGNAL PROCESSING APPARATUS AND METHOD FOR PROCESSING AN INPUT AUDIO SIGNAL

CROSS-REFERENCE TO RELATED APPLICATIONS

This application is a continuation of International Application No. PCT/EP2016/055622, filed on Mar. 16, 2016, the disclosure of which is hereby incorporated by reference in its entirety.

TECHNICAL FIELD

In general, the present application relates to the field of audio signal processing. More specifically, the present application relates to an audio signal processing apparatus and method for processing an input audio signal, in particular a compressed audio signal.

BACKGROUND

Generally, compressing an audio file, in particular a music file, using a lossy encoding scheme, such as MP3, leads to a decreased audio quality. The audio cannot be restored in its original quality, because due to the compression, for instance, high frequencies are lost, transients are distorted or weakened and other artifacts are introduced.

Early attempts to address this problem suggest recovering the original audio quality by using bandwidth extension techniques, as disclosed, for instance, in U.S. Pat. No. 7,916,876 and EP1915026. More recent attempts to address this problem suggest the use of equalization or bass maximization techniques, as disclosed, for instance, in U.S. Pat. Nos. 6,865,430 and 6,606,388. U.S. Pat. No. 9,135,920 discloses a mid/side decomposition of a stereo signal, which is a very simple improvement compared to modifying the whole signal.

The conventional methods for improving the quality of compressed audio files, in particular music files, rely on bandwidth extension only to regenerate high frequency and/or general sound effects to increase perceptual quality (e.g., equalization). Thus, conventional bandwidth extension systems are mostly implemented consisting of a separate step to detect the cutoff frequency and, subsequently, to estimate the parts of the audio file above this estimated cutoff frequency lost due to compression. However, high frequency audio content in general is perceptually of little relevance (at frequencies above 12 kHz many people cannot perceive sound at all) and the detection of the actual high-frequency cut-off frequency is a difficult task. Moreover, other important effects on the perceived quality of the music that are not addressed by the conventional methods are the so-called "holes" in the spectrogram which create audible artifacts ("musical noise", "birdie sounds") and the loss of the presence of attacks.

Thus, there is a need for an improved audio signal processing apparatus and method which allow, in particular, enhancing the quality of compressed audio signals.

SUMMARY

It is an object of the application to provide an improved signal processing apparatus and method allowing, in particular, to enhance the quality of compressed audio signals.

The foregoing and other objects are achieved by the subject matter of the independent claims. Further implementation forms are apparent from the dependent claims, the description and the figures.

According to a first aspect, the application relates to an audio signal processing apparatus for processing an input audio signal, in particular a compressed audio signal, which has been compressed using a lossy compression technique, into an output audio signal in order to mitigate perceptually noticeable distortions caused by the compression. The audio signal processing apparatus comprises a decomposer configured to decompose the input audio signal into a direct audio signal and a diffuse audio signal, a modifier configured to modify the direct audio signal in order to obtain a modified direct audio signal, wherein the modifier comprises a bandwidth extender configured to extend an upper cutoff frequency of the frequency range of the direct audio signal and a combiner configured to combine the modified direct audio signal with the diffuse audio signal in order to obtain the output audio signal.

As used herein, the expression "direct audio signal" refers to components of the input audio signal directly emitted by a sound source and the expression "diffuse audio signal" refers to components of the input audio signal reflected by an environment of the sound source. The equivalent expressions "primary audio signal" and "ambient audio signal" will be used herein for the "direct audio signal" and the "diffuse audio signal" as well.

Thus, an improved audio signal processing apparatus is provided enhancing the quality of a compressed input audio signal by decomposing the input audio signal into a direct component and a diffuse component and by processing the direct component. This is because, the direct audio signal component generally relates to the dry signal of a sound source, whereas the diffuse audio signal component relates to the response of the environment (reverberation) to the direct audio signal. Thus, the diffuse audio signal component already contains the reverberation that is naturally present in the input audio signal. Therefore, the modules as described in the following can be applied in an advantageous manner.

In a first possible implementation form of the audio signal processing apparatus according to the first aspect of the application, the decomposer comprises an upmixer configured to upmix the input audio signal into a plurality of upmixed audio signals, wherein the decomposer is configured to generate the direct audio signal and the diffuse audio signal on the basis of the plurality of upmixed audio signals.

An upmixer allows an efficient generation of the direct and diffuse audio signal. Thus, it enables the further processing which handles the direct and diffuse audio signal differently.

In a second possible implementation form of the audio signal processing apparatus according to the first implementation form of the first aspect, the plurality of upmixed audio signals include a center audio signal, wherein the decomposer further comprises a downmixer configured to downmix the center audio signal of the plurality of upmixed audio signals in order to obtain the direct audio signal.

Thus, all components of the modifier can work on a reduced number of channels, which reduces the overall computational complexity of the apparatus.

In a third possible implementation form of the audio signal processing apparatus according to the first or the second implementation form of the first aspect, the decomposer further comprises an equalizer configured to equalize the plurality of upmixed audio signals.

Using the equalizer on the plurality of upmixed signals enables the usage of separate settings for each of the signals. Thus, the equalizer can be configured efficiently to achieve the desired effect, by having a good control over all the separate signals. In an implementation form, the equalizer can be configured to enhance the direct audio signal at low frequencies and the diffuse audio signal at medium frequencies. This has the advantage that the bass of the direct audio signal and the ambient sound of the diffuse audio signal is enhanced. Other possible configurations of the equalizer can aim at different goals.

In a fourth possible implementation form of the audio signal processing apparatus according to the first aspect as such or any one of the first to third implementation form thereof, the bandwidth extender comprises a plurality of bandpass filters configured to extract a plurality of direct audio signal components from the direct audio signal, wherein each direct audio signal component is associated with a corresponding frequency band of a plurality of frequency bands defined by the plurality of bandpass filters, and wherein the bandwidth extender further comprises an energy estimator configured to estimate for each frequency band of the plurality of frequency bands the energy of the direct audio signal component associated with the corresponding frequency band.

The separation into different bands and the estimation of energy in these bands allows for an implicit estimation of the cutoff frequency. Thus, the following processing steps can work on a fine-grained spectral resolution.

In a fifth possible implementation form of the audio signal processing apparatus according to the fourth implementation form of the first aspect, the bandwidth extender further comprises a harmonics generator configured to generate on the basis of a first direct audio signal component of the plurality of direct audio signal components an adjustment direct audio signal component containing harmonics of the first direct audio signal component for adjusting a second direct audio signal component of the plurality of direct audio signal components, when the energy of the second direct audio signal component is smaller than a target energy of the second direct audio signal component.

In case the actual energy is equal or close to the target energy, no harmonics are created, which reduces the computational complexity of embodiments of the application.

In a sixth possible implementation form of the audio signal processing apparatus according to the fifth implementation form of the first aspect, the target energy of the second direct audio signal component is determined on the basis of the following equation:

$$T_x = \beta_1 T_{x-1},$$

wherein $T_x$ denotes the target energy of the second direct audio signal component, $T_{x-1}$ denotes the target energy of a direct audio signal component associated with the frequency band directly below the frequency band of the second direct audio signal component and $\beta_1$ denotes a first adjustment factor with $\beta_1 < 1$.

In an implementation form the first adjustment factor $\beta_1$ is defined by the following equation:

$$\beta_1 = \frac{T_{x-1}}{T_{x-2}},$$

wherein $T_{x-2}$ denotes the target energy of a direct audio signal component associated with the frequency band directly below the frequency band, which is below the frequency band of the second direct audio signal component.

Thus, the target energies can be estimated recursively from the available measured energy estimates.

In a seventh possible implementation form of the audio signal processing apparatus according to the fifth or sixth implementation form of the first aspect, the bandwidth extender further comprises a scaler configured to scale the adjustment direct audio signal component for the second direct audio signal component using a scaling factor determined on the basis of the energy of the first direct audio signal component.

This implementation form allows using a cutoff frequency that lies in one of the frequency bands, circumventing the need to explicitly detect the cutoff frequency in the signal using a separate step.

In an eighth possible implementation form of the audio signal processing apparatus according to the seventh implementation form of the first aspect, the scaler is configured to determine the scaling factor $G_h$ for scaling the adjustment direct audio signal component for the second direct audio signal component on the basis of the following equation:

$$G_h = \frac{T_h}{E_h},$$

wherein $T_h$ denotes the target energy of the adjustment direct audio signal component for the second direct audio signal component and $E_h$ denotes the energy of the adjustment direct audio signal component for the second direct audio signal component and wherein $T_h$ and $E_h$ are defined by the following equations:

$$T_h = T_x - l \cdot E_x, \text{ and}$$

$$E_h = \beta_2 \cdot E_l,$$

wherein $E_x$ denotes the energy of the second direct audio signal component, $E_l$ denotes the energy of the first direct audio signal component, l denotes a leakage factor and $\beta_2$ denotes a second adjustment factor.

In an implementation form, the leakage parameter l has a value in the range from 0.5 to 1.0, preferably 0.8, and the second adjustment factor $\beta_2$ can have a value in the range from 0.3 to 0.5, preferably 0.4.

Thus, the energy of the adjustment direct audio signal is estimated from the energy of the first direct audio signal component. This reduces the computational complexity of the apparatus.

In a ninth possible implementation form of the audio signal processing apparatus according to the first aspect as such or any one of the first to eighth implementation form thereof, the modifier further comprises a transient modifier configured to detect at least one transient in the direct audio signal and to modify the transient in the direct audio signal.

Thus, transients that are weakened or lost due to the compression can be regained.

In a tenth possible implementation form of the audio signal processing apparatus according to the first aspect as such or any one of the first to ninth implementation form thereof, the modifier further comprises a reverberation filter configured to filter the direct audio signal using different reverberation times for different frequency bands of the direct audio signal, wherein the reverberation time associated with at least one high frequency band of the direct audio signal is larger than the reverberation time associated with at least one low frequency band of the direct audio signal.

In an implementation form the reverberation time is $T_{60}=0.2$ sec for frequencies below 4000 Hz and $T_{60}=0.4$ sec for frequencies between 4000 Hz and 10000 Hz. This allows compensating for the observed effect that ambient signal components are stronger attenuated at higher frequencies. If no additional reverberation is created at low frequencies, a clearer perception of low frequency components can be retained.

In an eleventh possible implementation form of the audio signal processing apparatus according to the tenth implementation form of the first aspect, the modifier further comprises a reverberation adjuster configured to adjust the direct audio signal filtered by the reverberation filter on the basis of a third adjustment factor, wherein the third adjustment factor depends on a ratio between the energy of the diffuse audio signal and the direct audio signal provided by the decomposer.

This ensures that the reverberation can be controlled depending on the actual amount of reverberation that is already in the signal.

In a twelfth possible implementation form of the audio signal processing apparatus according to the eleventh implementation form of the first aspect, the reverberation adjuster is configured to adjust the direct audio signal filtered by the reverberation filter on the basis of the third adjustment factor such that the ratio between the energy of the modified direct audio signal and the diffuse audio signal of the output audio signal is larger than a predefined fraction of the ratio between the energy of the diffuse audio signal and the direct audio signal provided by the decomposer.

In an implementation form the predefined fraction of the ratio between the energy of the diffuse audio signal and the direct audio signal provided by the decomposer is about 0.8, i.e. 20%. This ensures that the overall balance of the signal is not changed too much.

Summarizing the above, it is advantageous to apply at least some of the modifications described above only to the direct audio signal. The transient modifier can better detect the transients from the direct signal, as compared to from the full signal or from the diffuse signal, because the diffuse signal contains mostly stationary sounds, and thus, removing it from the direct signal improves the performance of the transient detection. The reverberation module generates additional artificial reverberation, by filtering with a reverberation filter. This filter is ideally applied on a dry signal, and thus, it is applied only on the direct signal and not on the diffuse. Similarly, the bandwidth extension is ideally only applied on the direct signal and not on the diffuse signal, because the creation of harmonics works better for direct signals. The multichannel EQ module can apply different EQ settings on the separated direct and diffuse signal. This enables a more fine-grained tuning of the system.

According to a second aspect, the application relates to an audio signal processing method for processing an input audio signal into an output audio signal. The audio signal processing method comprises the steps of: decomposing the input audio signal into a direct audio signal and a diffuse audio signal, wherein the direct audio signal comprises components of the input audio signal directly emitted by a sound source and wherein the diffuse audio signal comprises components of the input audio signal reflected by an environment of the sound source, modifying the direct audio signal in order to obtain a modified direct audio signal by extending an upper cutoff frequency of the frequency range of the direct audio signal, and combining the modified direct audio signal with the diffuse audio signal in order to obtain the output audio signal.

In a first possible implementation form of the audio signal processing method according to the second aspect of the application, the step of decomposing comprises the steps of upmixing the input audio signal into a plurality of upmixed audio signals and generating the direct audio signal and the diffuse audio signal on the basis of the plurality of upmixed audio signals.

In a second possible implementation form of the audio signal processing method according to the first implementation form of the second aspect, the plurality of upmixed audio signals include a center audio signal, wherein the step of decomposing further comprises a step of downmixing the center audio signal of the plurality of upmixed audio signals in order to obtain the direct audio signal.

In a third possible implementation form of the audio signal processing method according to the first or the second implementation form of the second aspect, the step of decomposing further comprises a step of equalizing the plurality of upmixed audio signals.

In a fourth possible implementation form of the audio signal processing method according to the second aspect as such or any one of the first to third implementation form thereof, the method comprises the further step of extracting a plurality of direct audio signal components from the direct audio signal using a plurality of bandpass filters, wherein each direct audio signal component is associated with a corresponding frequency band of a plurality of frequency bands defined by the plurality of bandpass filters, and wherein the method further comprises a step of estimating for each frequency band of the plurality of frequency bands the energy of the direct audio signal component associated with the corresponding frequency band.

In a fifth possible implementation form of the audio signal processing method according to the fourth implementation form of the second aspect, the method further comprises the step of generating on the basis of a first direct audio signal component of the plurality of direct audio signal components an adjustment direct audio signal component containing harmonics of the first direct audio signal component for adjusting a second direct audio signal component of the plurality of direct audio signal components, when the energy of the second direct audio signal component is smaller than a target energy of the second direct audio signal component.

In a sixth possible implementation form of the audio signal processing method according to the fifth implementation form of the second aspect, the target energy of the second direct audio signal component is determined on the basis of the following equation:

$$T_x = \beta_1 T_{x-1},$$

wherein $T_x$ denotes the target energy of the second direct audio signal component, $T_{x-1}$ denotes the target energy of a direct audio signal component associated with the frequency band directly below the frequency band of the second direct audio signal component and $\beta_1$ denotes a first adjustment factor with $\beta_1 < 1$.

In an implementation form the first adjustment factor $\beta_1$ is defined by the following equation:

$$\beta_1 = \frac{T_{x-1}}{T_{x-2}},$$

wherein $T_{x-2}$ denotes the target energy of a direct audio signal component associated with the frequency band directly below the frequency band, which is below the frequency band of the second direct audio signal component.

In a seventh possible implementation form of the audio signal processing method according to the fifth or sixth implementation form of the second aspect, the method comprises the further step of scaling the adjustment direct audio signal component for the second direct audio signal component using a scaling factor determined on the basis of the energy of the first direct audio signal component.

In an eighth possible implementation form of the audio signal processing method according to the seventh implementation form of the second aspect, the method comprises the further step of determining the scaling factor $G_h$ for scaling the adjustment direct audio signal component for the second direct audio signal component on the basis of the following equation:

$$G_h = \frac{T_h}{E_h},$$

wherein $T_h$ denotes the target energy of the adjustment direct audio signal component for the second direct audio signal component and $E_h$ denotes the energy of the adjustment direct audio signal component for the second direct audio signal component and wherein $T_h$ and $E_h$ are defined by the following equations:

$$T_h = T_x - l \cdot E_x, \text{ and}$$

$$E_h = \beta_2 \cdot E_l,$$

wherein $E_x$ denotes the energy of the second direct audio signal component, $E_l$ denotes the energy of the first direct audio signal component, l denotes a leakage factor and $\beta_2$ denotes a second adjustment factor.

In a ninth possible implementation form of the audio signal processing method according to the second aspect as such or any one of the first to eighth implementation form thereof, the method comprises the further steps of detecting at least one transient in the direct audio signal and modifying the transient in the direct audio signal.

In a tenth possible implementation form of the audio signal processing method according to the second aspect as such or any one of the first to ninth implementation form thereof, the method comprises the further step of filtering the direct audio signal using a reverberation filter with different reverberation times for different frequency bands of the direct audio signal, wherein the reverberation time associated with at least one high frequency band of the direct audio signal is larger than the reverberation time associated with at least one low frequency band of the direct audio signal.

In an eleventh possible implementation form of the audio signal processing method according to the tenth implementation form of the second aspect, the method comprises the further step of adjusting the direct audio signal filtered by the reverberation filter on the basis of a third adjustment factor, wherein the third adjustment factor depends on a ratio between the energy of the diffuse audio signal and the direct audio signal.

In a twelfth possible implementation form of the audio signal processing method according to the eleventh implementation form of the second aspect, the direct audio signal filtered by the reverberation filter is adjusted on the basis of the third adjustment factor such that the ratio between the energy of the modified direct audio signal and the diffuse audio signal of the output audio signal is larger than a predefined fraction of the ratio between the energy of the diffuse audio signal and the direct audio signal.

According to a third aspect, the application relates to a computer program comprising a program code for performing the audio signal processing method according to the second aspect of the application or any one of its implementation forms when executed on a computer.

The application can be implemented in hardware and/or software and any combination thereof.

BRIEF DESCRIPTION OF THE DRAWINGS

Further embodiments of the application will be described with respect to the following figures, wherein.

In the various figures, identical reference signs will be used for identical or at least functionally equivalent features.

DETAILED DESCRIPTION OF EMBODIMENTS

In the following description, reference is made to the accompanying drawings, which form part of the disclosure, and which show, by way of illustration, specific aspects in which the present application may be implemented. It is understood that other aspects may be utilized and structural or logical changes may be made without departing from the scope of the present application. The following detailed description, therefore, is not to be taken in a limiting sense, as the scope of the present application is defined by the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
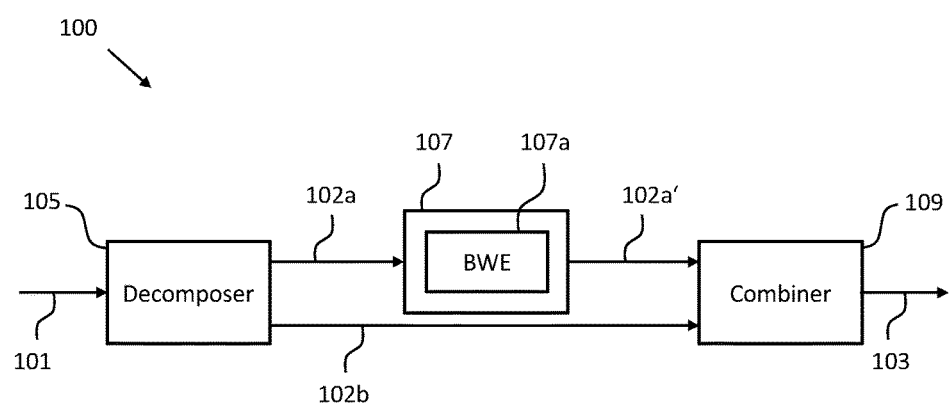
FIG. 1 shows a schematic diagram of an audio signal processing apparatus according to an embodiment.

FIG. 1 shows a schematic diagram of an audio signal processing apparatus 100 for processing an input audio signal 101 into an output audio signal 103 according to an embodiment. As will be described in more detail further below, according to embodiments of the application the input audio signal 101 and/or the output audio signal 103 can be stereo audio signals or multichannel signals having a different number of channels. The input audio signal 101 can be a compressed input audio signal 101, which has been compressed using a lossy compression technique.

The audio signal processing apparatus 100 comprises a decomposer 105 configured to decompose the input audio signal 101 into a direct audio signal 102a and a diffuse audio signal 102b, a modifier 107 configured to modify the direct audio signal 102a in order to obtain a modified direct audio signal 102a', wherein the modifier 107 comprises a bandwidth extender 107a configured to extend the frequency range of the direct audio signal 102a to higher frequencies, or in other words to extend or increase an upper cut-off frequency of the frequency range, and a combiner 109 configured to combine the modified direct audio signal 102a' with the diffuse audio signal 102b in order to obtain the final output audio signal 103.

Figure 2:
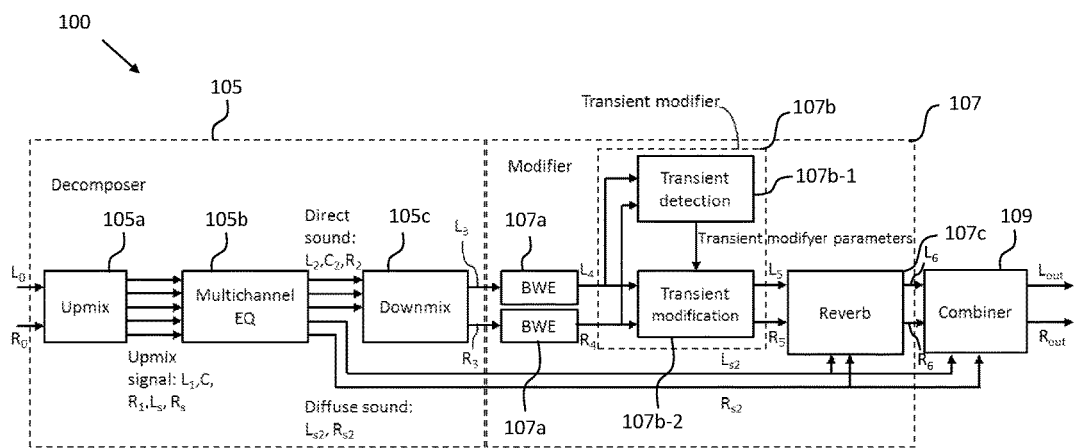
FIG. 2 shows a schematic diagram of an audio signal processing apparatus according to an embodiment.

FIG. 2 shows a schematic diagram of the audio signal processing apparatus 100 according to an embodiment. In the embodiment shown in FIG. 2 the audio signal processing apparatus 100 is configured to process the input audio signal 101 implemented as a stereo signal, i.e. comprising a left channel $L_0$ and a right channel $R_0$, and to provide the output audio signal as a stereo signal, i.e. comprising a left channel $L_{out}$ and a right channel $R_{out}$.

In the embodiment shown in FIG. 2 the decomposer 105 of the audio signal processing apparatus 100 comprises an upmixer 105a, an equalizer 105b and a downmixer 105c. The modifier 107 comprises a respective bandwidth extender 107a for the left and the right channel, a transient modifier 107b and a reverberation module 107c. The transient modifier 107b comprises a transient detection module 107b-1 and a transient modification module 107b-2. In the following it will be described in more detail how these different components of the audio signal processing apparatus 100 shown in FIG. 2 operate according to embodiments of the application.

In a first stage, the input audio signal $L_0$, $R_0$ is decomposed into its direct and diffuse signal components by the decomposer 105. The upmixer 105a of the decomposer 105 is configured to upmix the input audio signal $L_0$, $R_0$ into a plurality of upmixed audio signals. In the embodiment shown in FIG. 2, the upmixer 105a of the decomposer 105 is configured to upmix the input audio signal $L_0$, $R_0$ into a 5-channel signal $L_1$, $C$, $R_1$, $L_s$, $R_s$, comprising a center signal C a left and right channel direct signal $L_1$, $R_1$ and a left and right channel diffuse signal $L_s$, $R_s$.

In an embodiment, the upmix algorithm, described in He, J., Tan, E. L., & Gan, W. S., 2014, "Linear estimation based primary-ambient extraction for stereo audio signals", Audio, Speech, and Language Processing, IEEE/ACM Transactions on, 22(2), 505-517, can be implemented in the upmixer 105a in order to separate the direct signal component from the diffuse signal component. In an embodiment, the input signal x can be written in terms of the direct and diffuse components as follows:

$$x_0[m,l] = p_0[m,l] + a_0[m,l]$$

$$x_1[m,l] = p_1[m,l] + a_1[m,l],$$

where the subscript indices 0 and 1 denote the left and right channel of the input stereo signal, respectively. Referring to FIG. 2, the left channel of the input stereo signal $x_0$ corresponds to $L_0$, the right channel of the input stereo signal $x_1$ corresponds to $R_0$. The symbols p and a denote the direct (or primary) and diffuse (or ambient) components of the input audio signal x, respectively. The signals are indexed by discrete time m and discrete frequency bin l, as processing is normally done in the short-time Fourier transform (STFT) domain, namely independently for each time and frequency bin. Making use of the assumption of amplitude panning for the direct signal, $p_1$ can be expressed as follows:

$$p_1 = k \cdot p_0,$$

where k denotes the panning index. In an embodiment, the power of the ambient, i.e. diffuse signals in both channels is assumed to be equal, and the two ambient, i.e. diffuse signals are uncorrelated with respect to each other and with respect to the direct signals.

On the basis of these assumptions, the auto- and cross-correlations at zero-lag can be expressed as:

$$r_{00} = P_{p_0} + P_{a_0}$$

$$r_{11} = k^2 P_{p_0} + P_{a_0}$$

$$r_{01} = k P_{p_0},$$

where P denotes the power of a signal. In an embodiment, the auto- and cross-correlations of the signal can be measured and, from these, the panning index k can be derived on the basis of the following relation:

$$k = \frac{r_{11} - r_{00}}{2r_{01}} + \sqrt{\left(\frac{r_{11} - r_{00}}{2r_{01}}\right)^2 + 1}.$$

A direct, i.e. primary signal panned to the left is characterized by a panning index $0 \leq k < 1$, while a direct signal panned to the right has a panning index $k > 1$.

Based on the estimated panning index, several methods can be used in the context of the present application in order to estimate the direct and diffuse parts of the signal, for instance, the principal component analysis as described in He, J., Tan, E. L., & Gan, W. S. (2014), "Linear estimation based primary-ambient extraction for stereo audio signals", Audio, Speech, and Language Processing, IEEE/ACM Transactions on, 22(2), 505-517, where the direct and the diffuse signals can be expressed in the following way:

$$p_0 = \frac{1}{1+k^2}(x_0 + kx_1)$$

$$p_1 = \frac{k}{1+k^2}(x_0 + kx_1)$$

$$a_0 = \frac{k}{1+k^2}(kx_0 - x_1)$$

$$a_1 = -\frac{1}{1+k^2}(kx_0 - x_1).$$

In an embodiment of the application, the estimated frequency-domain signals can be transferred back to the time domain using an inverse STFT. Other methods for primary-ambient extraction are also suited, such as methods based on least squares.

The resulting diffuse, i.e. ambient signals can further be decorrelated, because most direct/diffuse separation methods do actually not create diffuse (uncorrelated) ambient signals.

In addition to the direct/diffuse separation, the center channel can be extracted from the direct signals. In embodiments of the application, a method can be used which does a repanning of all left-panned signals between the left and center channel, and of all right-panned signals between the center and right channel. In an embodiment of the application, a non-energy-preserving panning law can be used, wherein the panning index k is transformed into the panning angle on the basis of the following equation:

$$\varphi = \frac{k-1}{k+1},$$

wherein $-1 \leq \varphi \leq 1$. In an embodiment of the application, the center channel signal $x_c$ can be computed differently depending on whether the panning angle is negative or positive, as described in Faller, C. (2006), "Multiple-loudspeaker playback of stereo signals", Journal of the Audio Engineering Society, 54(11), 1051-1034, making use of the following equations:

$$\varphi < 0:$$
$$\varphi' = 2\varphi + 1$$
$$x^o = \frac{x_0}{\frac{1}{2}(1-\varphi)}$$
$$g_c = \frac{1}{2}(\varphi' + 1)$$
$$x_c = x^o g_c \frac{1}{\sqrt{2}}$$
$$x_0' = x_0 + x_1 - x_c \sqrt{2}$$
$$x_1' = 0$$
$$\varphi > 0:$$
$$\varphi' = 2\varphi - 1$$
$$x^o = \frac{x_1}{\frac{1}{2}(1+\varphi)}$$
$$g_c = \frac{1}{2}(\varphi' + 1)$$
$$x_c = x^o g_c \frac{1}{\sqrt{2}}$$
$$x_0' = 0$$
$$x_1' = x_0 + x_1 - x_c \sqrt{2}$$

The panning angle is mapped again to the range $-1 \leq \varphi' \leq 1$ in order to re-pan the signal between two loudspeakers. The signal $x^o$ denotes the original unpanned direct signal, which, together with the new center panning gain $g_c$ can be used to extract the center signal $x_c$. In embodiments of the application, the signals $x_0'$ and $x_1'$ are computed based on a non-energy-preserving panning law. The extraction of the center signal can be usually done in the frequency domain, for a frequency-dependent panning index k. This reflects the assumption that for each time-frequency bin, only one panned source is active.

According to embodiments of the application, instead of working directly on all frequency bins, frequencies can be grouped together according to some auditory-inspired grouping mechanism, in order to reduce the complexity and the amount of processing artifacts.

As can be taken from the embodiment shown in FIG. 2 and as already mentioned above, the output signals $p_0$, $p_1$, $x_c$, $a_0$, and $a_1$ of the upmixer 105a are the left direct signal $L_1$, right direct signal $R_1$, center direct signal C, left diffuse signal $L_s$, and right diffuse signal $R_s$, respectively.

One advantage of using the upmixer 105a is that, in the subsequent processing steps, different signal modifications can be separately applied to the direct and the diffuse part, as well as to the center channel. This is especially useful for the application of compressed music enhancement. For example, in embodiments of the application, equalization can be applied to the center channel, which in case of an audio input signal representing music normally contains the singing voice. Furthermore, it is reasonable to create additional reverberation only from the direct signal, since the diffuse signal already contains some reverberation.

In a next stage, the output signal of the upmixer 105a is provided as input to the multichannel equalizer 105b. In an embodiment, the equalizer 105b comprises a filter-bank with center frequencies of 62.5 Hz, 125 Hz, 250 Hz, 500 Hz, 1000 Hz, 2000 Hz, 4000 Hz, 8000 Hz and 16000 Hz. For this frequency division a proposed configuration of the equalizer is to set the gains (in dB) for all direct signals to [2 2 0 0 0 0 0 2 3] and for all diffuse signals to [−2 −2 0 2 3 3 2 0 0]. This setting boosts the bass of the direct signals and the mid frequencies of the diffuse signals, which results in the recreation of a warm smoothness of the diffuse, i.e. ambient sound, while keeping the low frequencies clear and well defined. Since diffuse sound components typically exhibit less high frequency content than direct sound components and direct sound components are stronger affected by the loss of high frequencies, the gains can be set differently for high frequencies in the direct and diffuse equalizer 105b. Other settings of the equalizer 105b can be used, for example a separate gain setting for the center signal C which can be exploited to give a special equalization to the voice of a singer.

As can be taken from the embodiment shown in FIG. 2, the output signals of the equalizer 105b are a left direct signal $L_2$, a right direct signal $R_2$, a center direct signal $C_2$, a left diffuse signal $L_{s2}$ and a right diffuse signal $R_{s2}$.

While according to embodiments of the application the diffuse signal components are essentially not changed anymore and remain unaffected from the remaining system components, the direct signal components, instead, are further processed by the modifier 107.

In the embodiment shown in FIG. 2, a separate processing is performed on the center signal and the downmixer 105c is used to mix the center signal into the direct left and right signals. In an embodiment, a simple method can be used to mix the center signal $C_2$, in the downmixer 105c into the direct left and direct right signals $L_3$ and $R_3$ according to the following relations:

$$L_3 = L_2 + \frac{1}{\sqrt{2}} C_2$$
$$R_3 = R_2 + \frac{1}{\sqrt{2}} C_2,$$

where $L_2$, $C_2$, and $R_2$ denote the input signals of the downmixer 105c.

In a next stage, the output signals $L_3$ and $R_3$ of the downmixer 105c are provided as input signals to the modifier 107, in particular to two bandwidth (BW) extenders 107a thereof. As will be described in more detail further below in the context of FIG. 3, the main purpose of the BW extenders 107a is to create the lost high-frequency components of the compressed input audio signal.

In a next stage of the audio signal processing apparatus 100 shown in FIG. 2, the output signals $L_4$ and $R_4$ of the BW extenders 107a are provided as input signals to the transient modifier 107b, comprising a transient detection module 107b-1 and a transient modification module 107b-2.

The main purpose of the transient modifier 107b is to find transient signal parts within the direct signals and to provide the possibility to boost or attenuate these transient signal parts. In an embodiment, the transient modifier 107b, comprising the transient detection module 107b-1 and the transient modification module 107b-2 is implemented to detect and modify transients of the direct signals according to the following algorithm.

A transient signal can be divided into two parts or phases, namely the attack phase and the sustain phase. These parts or phases can be detected and modified separately. In order to detect the attack phase and the sustain phase of a transient, different signal envelopes can be computed, based on the maximum absolute amplitude in the present frame of the signal s [t] at time step t:

$$x_{max} = 20\log_{10}\left(\max_i |s[t]|\right), \text{ and}$$

$$s_{att,f}[t] = \alpha_{att,f} \cdot s_{f,att}[t-1] + (1 - \alpha_{att,f}) \cdot x_{max},$$

wherein in an embodiment $\alpha_{att,f}$ is chosen to be $\alpha_{att,f,a}$ if $x_{max} > s_{att,f}$ and to be $\alpha_{att,f,r}$ else.

The value $s_{att,f}[t]$ corresponds to the fast envelope for attack detection. Accordingly, a slow envelope $s_{att,s}$ for attack detection can be computed. The attack envelope can be estimated by using the equation $e_{att} = s_{att,f} - s_{att,s}$. For release shaping, a fast and a slow envelope can be computed accordingly and can be used to estimate a release envelope $e_{rel}$. Then, the attack envelope and release envelope can directly be used as an attack gain and release gain, respectively. These gains can be limited to be smaller than a maximum gain limit, which may be set to 6 dB. Additionally, these gains may be scaled to modify the effect, e.g. to make it larger or smaller, or to even apply a negative gain, which corresponds to transient suppression. In practice, the values for the smoothing constants α can be expressed in terms of time constants t, which makes them easier to tune. In an embodiment, the relation between the time constant t and the smoothing constant α is as follows:

$$\alpha = e^{\frac{1}{f_s t}},$$

where $f_s$ denotes the sampling rate. Useful values for the time constants are given in the following table:

| | |
|---|---|
| $t_{att, f, a}$ | 0.008 s |
| $t_{att, f, r}$ | 0.004 s |
| $t_{att, s, a}$ | 0.015 s |
| $t_{att, s, r}$ | 0.004 s |
| $t_{rel, f, a}$ | 0.02 s |
| $t_{rel, f, r}$ | 0.004 s |
| $t_{rel, s, a}$ | 0.02 s |
| $t_{rel, s, r}$ | 0.02 s |

It can be assumed that transient signals are included in the direct signals after the upmix, whereas the diffuse signal contains mostly time-smooth ambient signals.

Embodiments of the application simplify the detection of transients by the separation of the direct sound components from the diffuse ones. In fact, in the direct sound components, transient sound components are clearer, while in the diffuse sound components reverberation effects can smear transient sounds. Moreover, after the detection of a transient sound, the modification (typically enhancement) can be selectively applied only to the direct sound components. This is beneficial, because it allows boosting only the direct sound components, while avoiding any modification of the diffuse sound components, which typically relate to reverberation. As reverberation is a property of the environment, any changes of the reverberation would create an unnatural listening experience. Therefore, transient detection and modification is more efficient and creates a more natural listening experience if only applied to the direct signal.

As can be taken from the embodiment shown in FIG. 2, in a next stage, the output signals $L_5$ and $R_5$ of the transient modifier 107 are provided as input signals to the reverberation module 107c in order to add some artificial reverberation to the direct signal. The aim of this procedure is to recover diffuse, i.e. ambient signal components, which were removed during the lossy compression, as will be described in more detail further below in the context of FIG. 5.

Figure 3:
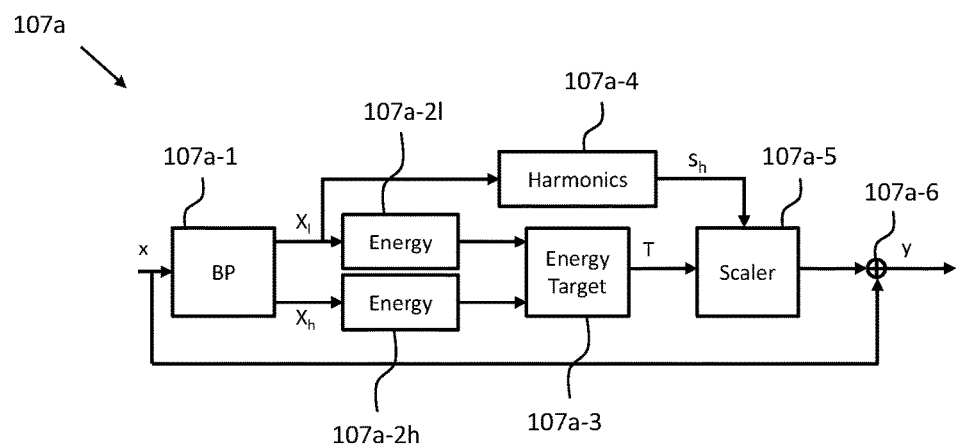
FIG. 3 shows a schematic diagram illustrating in more detail a bandwidth extender of an audio signal processing apparatus according to an embodiment.

FIG. 3 shows a schematic diagram of a possible implementation of a portion of the bandwidth extender 107a configured to extend the upper cutoff frequency of the frequency range of the direct signals, i.e. to recreate the lost high frequency components of the compressed audio signal. In the embodiment shown in FIG. 3 the bandwidth extender 107a comprises a plurality of bandpass filters 107a-1 (for the sake of clarity only one is shown in FIG. 3), energy estimators 107a-21, 107a-2h, a target energy module 107a-3, a harmonics generator 107a-4, a scaler 107a-5 and an adder 107a-6.

Figure 4:
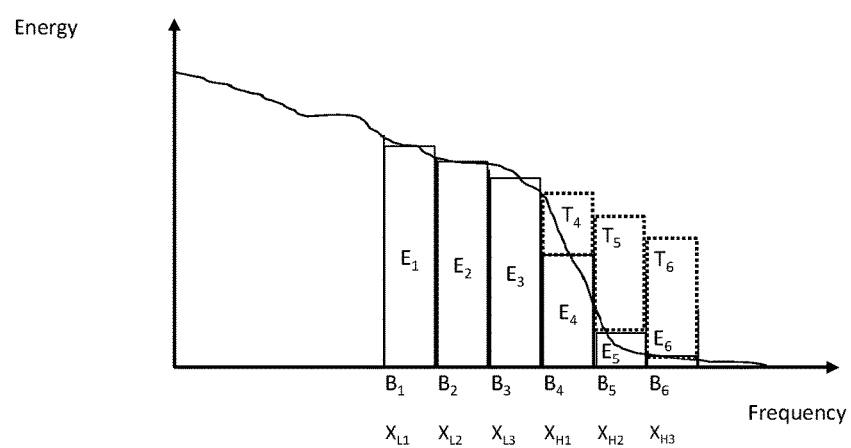
FIG. 4 shows a schematic diagram illustrating an aspect of the bandwidth extender shown in FIG. 3 according to an embodiment.

FIG. 4 shows exemplarily the effect of a bandwidth extender 107a of FIG. 3 on the frequency distribution of an exemplary direct signal. This example shows the six frequency band signals $B_1$ to $B_6$ extracted from the direct signal x of FIG. 3, wherein the three low frequency band signals $B_1$, $B_2$, $B_3$ are also referred to as $X_{L1}, X_{L2}, X_{L3}$ and the three high frequency band signals $B_4$, $B_5$, $B_6$ are also referred to as $X_{H1}, X_{H2}, X_{H3}$ to indicate the pairwise association of the low frequency band signal $X_{L1}$ to the high frequency band signal $X_{H1}$, of the low frequency band signal $X_{L2}$ to the high frequency band signal $X_{H2}$ and of the low frequency band signal $X_{L3}$ to the high frequency band signal $X_{H3}$. The six frequency band signals $B_1$ to $B_6$, are further referred to as direct audio signal components $B_1$ to $B_6$, and the three low frequency band signals $B_1$, $B_2$, $B_3$, or $X_{H1}, X_{H2}, X_{H3}$ are or form first direct audio signal components, and the three high frequency band signals $B_4$, $B_5$, $B_6$, or $4_1, X_2, X_3$, are or form the corresponding second direct audio signal components, which all together are or form three pairs of first direct audio signal components and second direct audio signal components.

As can be taken from the example shown in FIG. 4, in the high bands the measured energy $E_4, E_5, E_6$ is lower than the target energy $T_4, T_5, T_6$ in these bands $B_4, B_5, B_6$. As described in the following this "missing energy" (dotted areas in FIG. 4) is provided by the bandwidth extender 107a.

In the following, embodiments of the bandwidth extender 107a will be described in conjunction with FIG. 4 to provide a better understanding.

In an embodiment, the plurality of bandpass filters 107a-1 are configured to extract a plurality of direct audio signal components from the direct audio signal x, e.g. from each of the direct audio signals $L_3$, $R_3$ (see FIG. 2), wherein each direct audio signal component is associated with a corresponding frequency band of a plurality of frequency bands defined by the plurality of bandpass filters 107a-1. The energy estimators 107*a*-21 (l=low), 107*a*-2*h* (h=high) are configured to estimate for each frequency band of the plurality of frequency bands the energy of the direct audio signal component associated with the corresponding frequency band, e.g. $B_1$ to $B_6$ respectively $X_{L1}$ to $X_{H3}$. The harmonics generator 107*a*-4 is configured to generate on the basis of a first direct audio signal component, e.g. any of $X_{L1}$ to $X_{L3}$, of the plurality of direct audio signal components an adjustment direct audio signal component containing harmonics of the first direct audio signal component for adjusting a second direct audio signal component, e.g. any of the corresponding $X_{H1}$ to $X_{H3}$, of the plurality of direct audio signal components, when the energy of the second direct audio signal component is smaller than a target energy of the second direct audio signal component.

More specifically, in order to create the lost high frequency components of the compressed audio signal in the embodiment shown in FIG. 3, in a first stage the plurality of bandpass filters 107*a*-1 are applied to extract specific frequency bands from the input signal x, wherein x stands, for example, for any of $L_3$ or $R_3$. In an embodiment, those bands can be grouped into pairs of low frequency bands $X_l$ and high frequency bands $X_h$. This means that for each low frequency band $X_{l,i}$, (which corresponds to $X_{Li}$ as depicted in FIG. 4) there is a corresponding high frequency band $X_{h,i}$ (which corresponds to $X_{Hi}$ as depicted in FIG. 4), where l denotes a low frequency band, h denotes a high frequency band, and i denotes the band index within the low or high bands and the respective pair (with e.g. i=1 . . . 3 for the example of FIG. 4).

In a next stage, the actual signal energy $E_x$ can be computed in each of the bands x, where x is the band index over all bands (with e.g. x=1 . . . 6 for the example of FIG. 4) by the energy estimators 107*a*-21 and 107*a*-2*h*. For each of the high frequency bands $X_{h,i}$, a target energy $T_{h,i}$ can be computed by the target energy module 107*a*-3. Then, harmonics are created, e.g. harmonic signal $s_h$ in FIG. 3, by the harmonics generator 107*a*-4, if the actual signal energy in a frequency band $E_{h,i}$ is lower than the target energy in this frequency band $T_{h,i}$. The gain of the generated harmonics can be set accordingly in the scaler 107*a*-5 on the basis of an estimation of the harmonics energy based on the estimated energy of the low frequency band $E_{l,i}$.

The process for bandwidth extension described above, which according to embodiments of the application is implemented in the bandwidth extender 107*a* of the modifier 107, aims at creating a realistic spectral envelope, which represents a decaying energy curve towards higher bands. Advantageously, the process circumvents the need to explicitly detect the cutoff frequency in the signal, since it is implicitly estimated.

In an embodiment, the harmonics generator 107-4 is configured to generate harmonics that are one octave higher than the original signal. For such an implementation, the bands can be defined as follows. Each band has a lower and upper cutoff frequency $f_l$ and $f_u$, respectively. A parameter r can be used to define the resolution, which corresponds to the number of low bands and the number of high bands. Using the octave relation between low bands and high bands, the lower and upper cutoff frequencies are related according to $f_{i+r,l}=2 \cdot f_{i,l}$ (where, for example, the band $B_{i+r}$ with corresponding lower cutoff frequency $f_{i+r,l}$ could be the high band $X_{H2}$, then $\beta_i$ would correspond to the low band $X_{L2}$) and $\beta_{i+r,u}=2 \cdot f_{i,u}$, where i is the index of the band (e.g. i=1 . . . 3 of FIG. 4). Defining $f_0$ as the lower cutoff frequency of the first band, $\beta_{1,l}=f_0$, the cutoff frequencies of all bands can be set according to $f_{x,l}=f_0 \cdot 2^{(x-1)/r}$ and $f_{x,u}=f_0 \cdot 2^{x/r}$ where x is the band index over all bands (e.g. x=1 . . . 6 of FIG. 4).

Suitable bandpass filters with corresponding lower and upper cutoff frequencies can be used, for example, Butterworth filters of order 8. A possible value for the lower cutoff frequency of the first band is $f_0$=4500 Hz. The upper cutoff frequency of the last low band can be set to 9000 Hz, and the high bands are in the octave range from 9000 Hz to 18000 Hz. For a band resolution of r=3, which means that there are three low bands (e.g. $X_{L1}$ to $X_{L3}$ as shown in FIG. 4) and three high bands (e.g. $X_{H1}$ to $X_{H3}$ as shown in FIG. 4), the lower cutoff frequencies of the second and third low bands can be set to 5666 Hz and 7138 Hz, respectively. For each of the bands x, the energy $E_x$ can be computed, for example, using the root mean square energy:

$$E_x = \sqrt{\Sigma_{i=1}^{N} s_x^2[i]},$$

where N is the number of samples in the observed short-time frame, and $s_x$ is the signal in band x, e.g. $B_2$ in FIG. 4.

For the low bands, the target energy can be set equal to the computed energy, $T_{l,i}=E_{l,i}$. For the high bands, the target energy can be set to ensure a decaying energy curve according to the following relation described in Arora, A E S 2006, 'High Quality Blind Bandwidth Extension of Audio for Portable Player Applications':

$$T_x = \frac{T_{x-1}}{T_{x-2}} T_{x-1}.$$

More generally, the target energy can be set to ensure a decaying energy curve according to the following relation according to the following relation:

$$T_x = \beta_1 T_{x-1},$$

wherein $T_x$ denotes the target energy of the second direct audio signal component (e.g., $T_5$ for the high band $B_5$ in FIG. 4), $T_{x-1}$ denotes the target energy of a direct audio signal component associated with the frequency band directly below the frequency band of the second direct audio signal component (e.g., $T_4$ for the high band $B_4$ in FIG. 4) and $\beta_1$ denotes a first adjustment factor with $\beta_1<1$. Thus, in the above embodiment the first adjustment factor $\beta_1$ is given by the ratio $T_{x-1}/T_{x-2}$.

In order to create a harmonics signal $s_h$, the following approach may be employed:

$$s_h = 2 \cdot |s_x|,$$

where $s_x$ is the input to the harmonics generator 107*a*-4, e.g. $X_{L1}$ from FIG. 4.

Many different functions can be used for creating harmonics, such as a half-wave or full-wave rectifier, clipper, or exponential function as described in Oo, N., Gan, W. S., & Hawksford, M. O. (2011), "Perceptually-motivated objective grading of nonlinear processing in virtual-bass systems", Journal of the Audio Engineering Society, 59(11), 804-824. After harmonics creation, a bandpass filter can be used to avoid aliasing and remove the DC component. The lower and upper cutoff frequencies of the pairs of corresponding low and high frequency bands are related according to $f_{i+r,l}=2 \cdot f_{i,l}$ and $f_{i+r,u}=2 \cdot f_{i,u}$, where, for example, the band $B_{i+r}$ with corresponding upper cutoff frequency $f_{i+r,u}$ could be the high band $X_{H2}$, and $B_i$ would be the low band $X_{L2}$).

As already described above, according to embodiments of the application harmonics are only created in a high band (FIG. 4: $B_4, \ldots, B_6$), when the actual energy $E_x$ is lower than the target energy, e.g. when $$T_x > l \cdot E_x,$$

where l denotes a leakage parameter. The target energy for the generated harmonics is $T_h = T_x - l \cdot E_x$ to ensure that the remaining energy in the high band and the resulting energy of the harmonics add up to $T_x$. A gain for the generated harmonics $G_h$ can be determined in the scaler 107a-5 according to the following relation:

$$G_h = \frac{T_h}{E_h},$$

where $E_h$ is the energy of the generated harmonics. For determining the gain $G_h$ in this way, the energy of the generated harmonics can be estimated (from another value) or measured directly from the generated harmonics. According to further embodiments of the application, the energy of the generated harmonics can be estimated on the basis of the corresponding low band energy $E_l$, of the lowband signal, e.g. $B_1$. In an embodiment, the harmonics energy can be estimated on the basis of the following relation:

$$E_h \approx 0.4 \cdot E_l.$$

In an embodiment, the harmonic gain $G_h$ can be limited to a maximum gain $G_h < G_{max}$, with $G_{max}$ being about 6 dB.

Thus, in an embodiment the scaler 107a-5 is configured to determine the scaling factor $G_h$ for scaling the adjustment direct audio signal component $s_h$ for the second direct audio signal (e.g., $X_{H2}$ in FIG. 4) component on the basis of the following equation:

$$G_h = \frac{T_h}{E_h},$$

wherein $T_h$ denotes the target energy of the adjustment direct audio signal component for the second direct audio signal component and $E_h$ denotes the energy of the adjustment direct audio signal component $s_h$ for the second direct audio signal component and wherein $T_h$ and $E_h$ are defined by the following equations:

$$T_h = T_x - l \cdot E_x, \text{ and}$$

$$E_h = \beta_2 \cdot E_l,$$

wherein $E_x$ denotes the energy of the second direct audio signal component (e.g., $X_{H2}$ in FIG. 4), $E_l$ denotes the energy of the first direct audio signal component $E_{x-r}$ (e.g., $X_{L2}$ in FIG. 4), l denotes the leakage factor and $\beta_2$ denotes a second adjustment factor.

According to embodiments of the application, the leakage parameter l has a value in the range from 0.5 to 1.0, preferably 0.8, and the second adjustment factor $\beta_2$ has a value in the range from 0.3 to 0.5, preferably 0.4.

The final output signal y (e.g. $L_4$ and $R_4$ of FIG. 2) of the BW extender 107a is obtained by the adder 107a-6 from the sum of the output signal (potentially in different frequency bands) of the scaler 107a-5 and of the input signal x.

As already mentioned above, advantageously, embodiments of the application do not require an explicit estimation of the cutoff frequency. Rather, the audio signal processing apparatus can operate on the basis of a cutoff frequency that lies in any of the high bands. In addition, embodiments of the application ensure that the signal is only modified, if necessary. In case the actual energy is equal or close to the target energy, no harmonics are created, which reduces the computational complexity of embodiments of the application. Furthermore, the final result of the bandwidth extender 107a is a natural-sounding output signal, which has a higher bandwidth than the original input signal.

Figure 5:
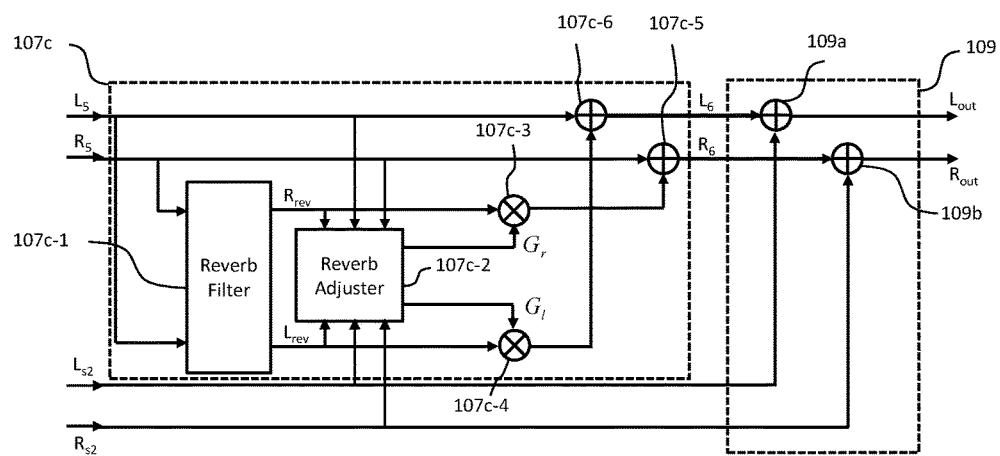
FIG. 5 shows a schematic diagram illustrating in more detail components of an audio signal processing apparatus according to an embodiment.

FIG. 5 shows a schematic diagram of the reverberation module 107c and the combiner 109 according to an embodiment. As already briefly described above, the purpose of the reverberation module 107c is to add some artificial reverberation to the direct signal in order to recover ambient signal components, which might have been removed by means of a lossy compression scheme. The reverberation module 107c shown in FIG. 5 comprises the reverberation filter 107c-1, the reverberation adjuster 107c-2 as well as two multiplication units 107c-3, 107c-4 and two adders or summations units 107c-5, 107c-6. The combiner 109, in turn, comprises two adders or summations units 109a, 109b.

In the embodiment shown in FIG. 5, the direct signals $L_5$, $R_5$ are filtered with the reverberation filter 107c in order to compute the artificial reverberation signals $L_{rev}$, $R_{rev}$. The artificial reverberation signals can be added to the direct signals simply by filtering (convolving) the direct signals with an appropriate impulse response in the time or frequency domain.

In embodiments of the application, an artificial reverberation is implemented which exhibits a frequency dependent reverberation time, which is used to mimic a natural reverberation effect that can be observed in a room where the reverberation time increases for lower frequencies. A beneficial implementation of the reverberation module 107c to achieve the desired effect of filling lost ambient (diffuse) signal components is to have an increasing reverberation time for higher frequencies. This allows compensating for the observed effect that ambient signal components are stronger attenuated for higher frequencies. If no additional reverberation is created for low frequencies, a clearer perception of low frequency components can be retained. In an embodiment, a possible setting for a frequency dependent reverberation time is $T_{60} = 0.2$ sec for frequencies below 4000 Hz, and $T_{60} = 0.4$ sec between 4000 Hz and 10000 Hz and $T_{60} = 0.2$ sec for frequencies above 10000 Hz. Thus, in an embodiment, the reverberation filter 107c-1 is configured to filter the direct audio signal using different reverberation times for different frequency bands of the direct audio signal, wherein the reverberation time associated with at least one high frequency band of the direct audio signal is larger than the reverberation time associated with at least one low frequency band of the direct audio signal.

In the case of a stereo signal, it is beneficial to use two different, uncorrelated reverberation filters on each input channel to generate a stereo reverberation.

As can be taken from the embodiment shown in FIG. 5, the artificial reverberation signal components $L_{rev}$, $R_{rev}$ can be gain adjusted in level using a gain factor $G_L$, $G_R$ in the multiplication units 107c-4 and 107c-3, respectively.

For determining the gain factors $G_L$, $G_R$, a fixed value can be used in order to control the strength of the reverberation according to embodiments of the application. However, to achieve the desired effect of masking audible artifacts without changing the perceived amount of reverberation contained in the signal, according to embodiments of the application an optimal value for the strength of the reverberation effect can be set depending on the input signal. The reverberation adjuster 107c-2 is configured to estimate optimal gain factors to achieve the desired effect on the basis of the direct and diffuse signals, as will be described in more detail further below. Thus, the reverberation adjuster 107c-2 is configured to adjust the direct audio signal filtered by the reverberation filter 107c-1 on the basis of a third adjustment factor, namely the gain factors $G_L$, $G_R$ depending on a ratio between the energy of the diffuse audio signal and the direct audio signal.

In embodiments of the application, the reverberation adjuster 107c-2 is configured to estimate the direct-to-diffuse energy ratio of the input signal and to control the gain such that the direct-to-diffuse energy ratio of the output signal is changed only marginally. According to embodiments of the application the desired effect can be achieved without significantly changing the perceived balance of direct and diffuse signals, if the direct-to-diffuse energy ratio is decreased by 10-20%.

The direct-to-diffuse signal ratio can be determined from the energy $E_{dir,L}$ of the left channel direct signal $L_5$ and the energy $E_{dir,R}$ of the right channel direct signal $R_5$, which are given by:

$$E_{dir,L} = \sqrt{\sum_{i=1}^{N} L_5^2[i]} \text{ and } E_{dir,R} = \sqrt{\sum_{i=1}^{N} R_5^2[i]},$$

respectively, and from the energy $E_{dif,L}$ of the left channel signal $L_{S2}$ and of the energy $E_{dif,R}$ of the right diffuse signal channel $R_{S2}$, which are given by:

$$E_{dir,L} = \sqrt{\sum_{i=1}^{N} L_{S2}^2[i]} \text{ and } E_{dir,R} = \sqrt{\sum_{i=1}^{N} R_{S2}^2[i]},$$

respectively.

According to embodiments of the application the estimation of the signal energies may also employ some temporal smoothing operation, e.g., using a first order IIR filter. From the direct and diffuse energy measurements, the direct-to-diffuse energy ratios $R_L$ and $R_R$ can be estimated as follows:

$$R_L = \frac{E_{dir,L}}{E_{dif,L}} \text{ and } R_R = \frac{E_{dir,R}}{E_{dif,R}}.$$

In the same way, the direct-to-diffuse energy ratios $R_{L,out}$ of the left and $R_{R,out}$ of the right output signal channels ($L_{out}$ and $R_{out}$) can be computed making use of the corresponding energies of output diffuse signals $E_{dif,out,L}$ and $E_{dif,out,R}$ respectively, where:

$$E_{dif,out,L} = \sqrt{\sum_{i=1}^{N} L_{S2}[i] + G_L \cdot L_{rev}[i])^2}, \text{ and}$$

$$E_{dif,out,R} = \sqrt{\sum_{i=1}^{N} R_{S2}[i] + G_R \cdot R_{rev}[i])^2}.$$

Then, making use of the former results, the following relations can be determined:

$$R_{L,out} = \frac{E_{dir,L}}{E_{dif,out,L}} \text{ and } R_{R,out} = \frac{E_{dir,R}}{E_{dif,out,R}}.$$

Depending on the chosen setting for the ratio of the input-to-output direct-to-diffuse energy ratios (typically, the desired effect can be achieved using a setting in the range of $$\frac{R}{R_{out}} \cong 1.1, \ldots, 1.3),$$

the optimal gain factors $G_L$, $G_R$ can be determined as follows.

It is assumed that the diffuse signals resulting from the reverberation filter 107c-1 are uncorrelated to the original diffuse signals resulting from the upmixer 105a and the following relations are used:

$$E_{rev,L} = \sqrt{\sum_{i=1}^{N} L_{rev}^2[i]}, \text{ and}$$

$$E_{rev,R} = \sqrt{\sum_{i=1}^{N} R_{rev}^2[i]},$$

wherein $E_{dif,out,L}$ and $E_{dif,out,R}$ can be approximated by:

$$E_{dif,out,L} = E_{dif,L} + G_L \cdot E_{rev,L}, \text{ and}$$

$$E_{dif,out,R} = E_{dif,R} + G_R \cdot E_{rev,R}.$$

From the definition of $$F = \frac{R}{R_{out}} = \frac{E_{dif,out}}{E_{dif}} \cong 1.1, \ldots, 1.3,$$

it follows that:

$$G_L = (F-1)\frac{E_{dif,L}}{E_{rev,L}}, \text{ and } G_R = (F-1)\frac{E_{dif,R}}{E_{rev,R}}.$$

For reducing the computational complexity, in embodiments of the present application the explicit estimation of $E_{rev}$ can be avoided by estimating it from $E_{dir}$ in combination with the transfer function of the reverberation filter 107c-1 (again under diffuse signal assumptions).

Based on the assumption that the direct signal components relate to the dry signal of a sound source and the diffuse, i.e. ambient signal components relate to the response of the environment (reverberation) to the direct sound components, it is beneficial to apply the reverberation module 107c only on the direct signal, since the diffuse signal already contains the reverberation that is naturally present in the input audio signal. As diffuse/ambient components are typically lost after the occurrence of strong direct components (due to the temporal masking effects which are typically exploited by lossy compression), embodiments of the application allow applying reverberation to the direct components, which replaces the missing ambient components. As a result, any holes in the ambient components are filled (702), which effectively reduces audible artifacts.

As can be taken from the embodiment shown in FIG. 5, after the artificial reverberation signals $L_{rev}$, $R_{rev}$ have been adjusted by means of the corresponding gain factors $G_L$, $G_R$ using the multiplication units 107c-4 and 107c-3, respectively, they are added to the direct signals $L_5$, $R_5$ in the adders summation units 107c-6 and 107c-5, respectively. In a final stage, the final output signals $L_{out}$, $R_{out}$ are obtained by adding the resulting modified direct signals $L_6$, $R_6$ to the diffuse signals $L_{S2}$, $R_{S2}$ using the adders 109a and 109b, respectively.

Figure 6:
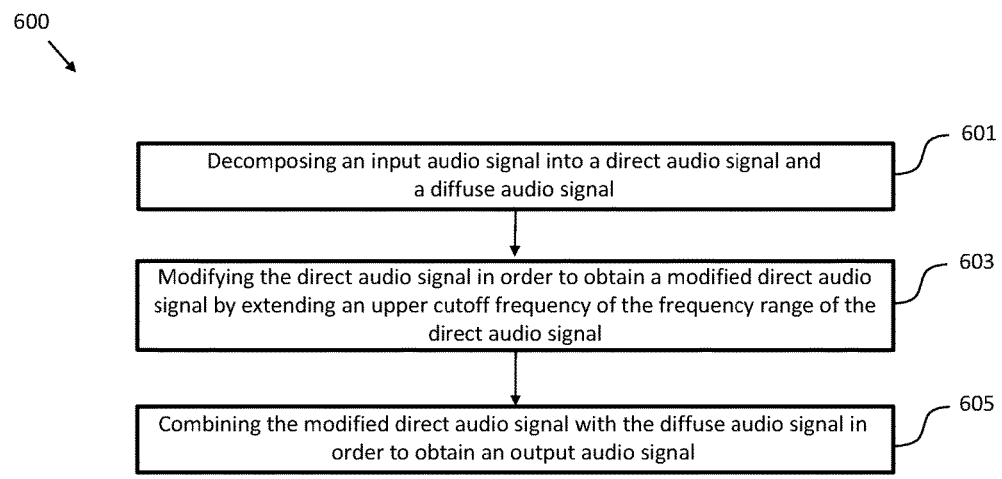
FIG. 6 shows a schematic diagram of an audio signal processing method according to an embodiment.

FIG. 6 shows a schematic diagram of an audio signal processing method 600 for processing an input audio signal into an output audio signal, such as the input audio signal 101 and the output audio signal 103 shown in FIG. 1. The audio signal processing method 600 comprises the steps of decomposing 601 the input audio signal 101 into a direct audio signal 102a and a diffuse audio signal 102b, modifying 603 the direct audio signal 102a in order to obtain a modified direct audio signal 102a' by extending or increasing the upper cutoff frequency of the frequency range of the direct audio signal 102a and combining 605 the modified direct audio signal 102a' with the diffuse audio signal 102b in order to obtain the output audio signal 103.

Figure 7:
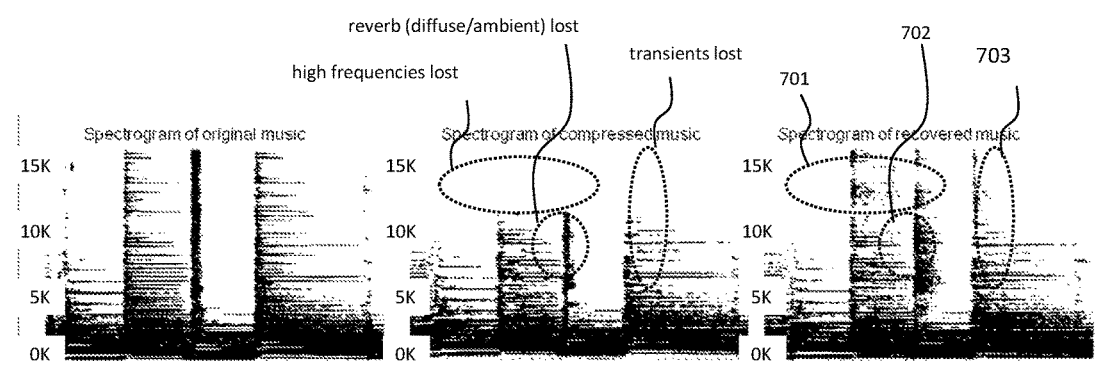
FIG. 7 shows a spectrogram of original music, compressed music, and recovered music that was processed using an audio signal processing apparatus and an audio signal processing method according to an embodiment.

FIG. 7 shows three respective spectrograms of a segment of original uncompressed music, the compressed music, and the recovered music that was processed with the audio signal processing apparatus 100 and the audio signal processing method according to an embodiment. The spectrogram of the compressed music shows that high-frequency parts of the signal are lost, and the reverberation and transients are weakened. In the spectrogram of the recovered music, high-frequency components are recovered (701), as well as parts of the reverberation (702) and transients (703).

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the application beyond those described herein. While the present application has been described with reference to one or more particular embodiments, those skilled in the art recognize that many changes may be made thereto without departing from the scope of the present application. It is therefore to be understood that within the scope of the appended claims and their equivalents, the application may be practiced otherwise than as specifically described herein.

What is claimed:

1. An audio signal processing apparatus for processing an input audio signal into an output audio signal, wherein the audio signal processing apparatus comprises:
   a decomposer configured to decompose the input audio signal into a direct audio signal and a diffuse audio signal;
   a modifier configured to modify the direct audio signal in order to obtain a modified direct audio signal, wherein the modifier comprises a bandwidth extender configured to extend an upper cutoff frequency of a frequency range of the direct audio signal; and
   a combiner configured to combine the modified direct audio signal with the diffuse audio signal to obtain the output audio signal;
   wherein the bandwidth extender comprises a plurality of bandpass filters configured to extract a plurality of direct audio signal components from the direct audio signal, wherein each direct audio signal component is associated with a corresponding frequency band of a plurality of frequency bands defined by the plurality of bandpass filters, and wherein the bandwidth extender further comprises an energy estimator configured to estimate, for each frequency band of the plurality of frequency bands, the energy of the direct audio signal component associated with the corresponding frequency band;
   wherein the bandwidth extender further comprises a harmonics generator configured to generate, based on a first direct audio signal component of the plurality of direct audio signal components, an adjustment direct audio signal component containing harmonics of the first direct audio signal component for adjusting a second direct audio signal component of the plurality of direct audio signal components, when the energy of the second direct audio signal component is smaller than a target energy of the second direct audio signal component;
   wherein the bandwidth extender further comprises a scaler configured to scale the adjustment direct audio signal component for the second direct audio signal component using a scaling factor determined based on the energy of the first direct audio signal component; and
   wherein the scaler is configured to determine the scaling factor $G_h$ for scaling the adjustment direct audio signal component for the second direct audio signal component based on the following equation:

$$G_h = \frac{T_h}{E_h},$$

wherein $T_h$ denotes the target energy of the adjustment direct audio signal component for the second direct audio signal component and $E_h$ denotes the energy of the adjustment direct audio signal component for the second direct audio signal component and wherein $T_h$ and $E_h$ are defined by the following equations:

$$T_h = T_x - l \cdot E_x, \text{ and}$$

$$E_h = \beta_2 \cdot E_l,$$

wherein $E_x$ denotes the energy of the second direct audio signal component, $E_l$ denotes the energy of the first direct audio signal component, l denotes a leakage factor and $\beta_2$ denotes a second adjustment factor.

2. The audio signal processing apparatus of claim 1, wherein the decomposer comprises an upmixer configured to upmix the input audio signal into a plurality of upmixed audio signals and wherein the decomposer is configured to generate the direct audio signal and the diffuse audio signal based on the plurality of upmixed audio signals.

3. The audio signal processing apparatus of claim 2, wherein the plurality of upmixed audio signals comprise a center audio signal and wherein the decomposer further comprises a downmixer configured to downmix the center audio signal of the plurality of upmixed audio signals to obtain the direct audio signal.

4. The audio signal processing apparatus of claim 2, wherein the decomposer further comprises an equalizer configured to equalize the plurality of upmixed audio signals.

5. The audio signal processing apparatus of claim 1, wherein the modifier further comprises a transient modifier configured to:
detect at least one transient in the direct audio signal; and
modify the at least one detected transient in the direct audio signal.

6. The audio signal processing apparatus of claim 1, wherein the modifier further comprises a reverberation filter configured to filter the direct audio signal using different reverberation times for different frequency bands of the direct audio signal, wherein the reverberation time associated with at least one high frequency band of the direct audio signal is larger than the reverberation time associated with at least one low frequency band of the direct audio signal.

7. The audio signal processing apparatus of claim 6, wherein the modifier further comprises a reverberation adjuster configured to adjust the direct audio signal filtered by the reverberation filter based on a third adjustment factor, wherein the third adjustment factor depends on a ratio between the energy of the diffuse audio signal and the direct audio signal provided by the decomposer.

8. The audio signal processing apparatus of claim 7, wherein the reverberation adjuster is configured to adjust the direct audio signal filtered by the reverberation filter based on the third adjustment factor, wherein the ratio between the energy of the modified direct audio signal and the diffuse audio signal of the output audio signal is larger than a predefined fraction of the ratio between the energy of the diffuse audio signal and the direct audio signal provided by the decomposer.

9. An audio signal processing apparatus for processing an input audio signal into an output audio signal, wherein the audio signal processing apparatus comprises:
at least one processor; and
a non-transitory computer-readable storage medium coupled to the at least one processor and storing programming instructions for execution by the at least one processor, wherein the programming instructions instruct the at least one processor to:
decompose the input audio signal into a direct audio signal and a diffuse audio signal using a decomposer;
modify the direct audio signal to obtain a modified direct audio signal by extending an upper cutoff frequency of a frequency range of the direct audio signal, wherein extending the upper cutoff frequency of the frequency range of the direct audio signal comprises using a bandwidth extender, the bandwidth extender comprising:
a plurality of bandpass filters configured to extract a plurality of direct audio signal components from the direct audio signal, wherein each direct audio signal component is associated with a corresponding frequency band of a plurality of frequency bands defined by the plurality of bandpass filters, and wherein the bandwidth extender further comprises an energy estimator configured to estimate, for each frequency band of the plurality of frequency bands, the energy of the direct audio signal component associated with the corresponding frequency band;

a harmonics generator configured to generate, based on a first direct audio signal component of the plurality of direct audio signal components, an adjustment direct audio signal component containing harmonics of the first direct audio signal component for adjusting a second direct audio signal component of the plurality of direct audio signal components, when the energy of the second direct audio signal component is smaller than a target energy of the second direct audio signal component; and
a scaler configured to scale the adjustment direct audio signal component for the second direct audio signal component using a scaling factor determined based on the energy of the first direct audio signal component, wherein the scaler is configured to determine the scaling factor $G_h$ for scaling the adjustment direct audio signal component for the second direct audio signal component based on the following equation:

$$G_h = \frac{T_h}{E_h},$$

wherein $T_h$ denotes the target energy of the adjustment direct audio signal component for the second direct audio signal component and $E_h$ denotes the energy of the adjustment direct audio signal component for the second direct audio signal component and wherein $T_h$ and $E_h$ are defined by the following equations:

$$T_h = T_x - l \cdot E_x, \text{ and}$$

$$E_h = \beta_2 \cdot E_l,$$

wherein $E_x$ denotes the energy of the second direct audio signal component, $E_l$ denotes the energy of the first direct audio signal component, l denotes a leakage factor and $\beta_2$ denotes a second adjustment factor; and
combine the modified direct audio signal with the diffuse audio signal to obtain the output audio signal.

10. The audio signal processing apparatus of claim 9, wherein the programming instructions further instruct the at least one processor to:
upmix the input audio signal into a plurality of upmixed audio signals; and
generate the direct audio signal and the diffuse audio signal based on the plurality of upmixed audio signals.

11. The audio signal processing apparatus of claim 10, wherein the plurality of upmixed audio signals comprise a center audio signal and wherein the programming instructions further instruct the at least one processor to:
downmix the center audio signal of the plurality of upmixed audio signals to obtain the direct audio signal.

12. The audio signal processing apparatus of claim 10, wherein the programming instructions further instruct the at least one processor to equalize the plurality of upmixed audio signals.

13. An audio signal processing apparatus for processing an input audio signal into an output audio signal, wherein the audio signal processing apparatus comprises:
a decomposer configured to decompose the input audio signal into a direct audio signal and a diffuse audio signal;
a modifier configured to modify the direct audio signal in order to obtain a modified direct audio signal, wherein the modifier comprises a bandwidth extender configured to extend an upper cutoff frequency of a frequency range of the direct audio signal; and a combiner configured to combine the modified direct audio signal with the diffuse audio signal to obtain the output audio signal;

wherein the bandwidth extender comprises a plurality of bandpass filters configured to extract a plurality of direct audio signal components from the direct audio signal, wherein each direct audio signal component is associated with a corresponding frequency band of a plurality of frequency bands defined by the plurality of bandpass filters, and wherein the bandwidth extender further comprises an energy estimator configured to estimate, for each frequency band of the plurality of frequency bands, the energy of the direct audio signal component associated with the corresponding frequency band;

wherein the bandwidth extender further comprises a harmonics generator configured to generate, based on a first direct audio signal component of the plurality of direct audio signal components, an adjustment direct audio signal component containing harmonics of the first direct audio signal component for adjusting a second direct audio signal component of the plurality of direct audio signal components, when the energy of the second direct audio signal component is smaller than a target energy of the second direct audio signal component; and wherein the target energy of the second direct audio signal component is determined based on the following equation:

$$T_x = \beta_1 T_{x-1},$$

wherein $T_x$ denotes the target energy of the second direct audio signal component, $T_{x-1}$ denotes the target energy of a direct audio signal component associated with the frequency band directly below the frequency band of the second direct audio signal component and $\beta_1$ denotes a first adjustment factor with $\beta_1 < 1$.

* * * * *